United States Patent [19]

Waller

[11] Patent Number: 5,787,311
[45] Date of Patent: Jul. 28, 1998

[54] INTEGRATED CIRCUIT MULTIPORT MEMORY HAVING SERIAL ACCESS BIT MASK REGISTER AND METHOD FOR WRITING IN THE MULTIPORT MEMORY

[75] Inventor: William K. Waller, Boise, Id.

[73] Assignee: Micron Technology, Inc., Boise, Id.

[21] Appl. No.: 528,181

[22] Filed: Sep. 14, 1995

Related U.S. Application Data

[63] Continuation of Ser. No. 171,370, Dec. 20, 1993, abandoned, which is a continuation of Ser. No. 73,247, Jun. 7, 1993, abandoned, which is a continuation of Ser. No. 989,456, Dec. 9, 1992, abandoned, which is a continuation of Ser. No. 433,339, Nov. 8, 1989, abandoned.

[51] Int. Cl.$^6$ .................................................. G06F 13/00
[52] U.S. Cl. .................... 395/869; 395/431; 395/164; 345/191; 345/197; 345/188; 365/189.01; 365/189.12; 365/230.15; 365/230.09; 364/DIG. 1
[58] Field of Search .............................. 364/200, 900; 340/703, 724, 799; 365/189.01, 240, 189.12, 189.08, 189.09, 230.03, 230.05, 230.09; 371/21.3; 345/191, 197, 188; 395/164, 431, 869

[56] References Cited

U.S. PATENT DOCUMENTS

| | | | |
|---|---|---|---|
| 4,648,077 | 3/1987 | Pinkham et al. | 365/189.12 |
| 4,727,363 | 2/1988 | Ishii | 345/190 |
| 4,823,119 | 4/1989 | Ishii | 345/188 |
| 4,891,794 | 1/1990 | Hush et al. | 365/189.04 |
| 4,933,879 | 6/1990 | Ando et al. | 395/164 |
| 4,933,900 | 6/1990 | Yamaguchi et al. | 365/189.03 |
| 4,942,593 | 7/1990 | Whiteside et al. | 375/372 |
| 4,958,345 | 9/1990 | Fujisaki | 371/21.3 |
| 4,999,620 | 3/1991 | Ishii | 345/188 |

OTHER PUBLICATIONS

"Datacube Proposal For One-Megabit Triple-Port Video Ram", J. Dunn; Datacube, Inc. Feb. 28, 1989.
Nakane, Masayoshi and Kaoru Tokushige; "Video Ram Chips Designed for Computer Graphics"; Nov. 1987; pp. 28 through 31; Journal of Electronic Engineering? (JEE).

Primary Examiner—Tod R. Swann
Assistant Examiner—J. Peikari
Attorney, Agent, or Firm—Schwegman, Lundberg, Woessner & Kluth, P.A.

[57] ABSTRACT

An integrated circuit (IC) architecture includes a bit mask register (BMR) and a serial access memory (SAM) which share address decode and clock circuitry within a multiport random access memory chip. The integrated circuit also includes a random access memory and circuitry for performing a bit masked transfer between the serial access memory and the random access memory. Mask data may be clocked into the bit mask register, which may be cleared upon completion of a data transfer between the random access memory and the serial access memory. The mask data may also be inverted upon being transferred between the random access memory and the bit mask register. This architecture provides CLEAR and TRUE or COMPLEMENT masked transfer output ability in the BMR, and has utility in realtime video windowing in memory mapped computer graphics.

20 Claims, 12 Drawing Sheets

INTEGRATED CIRCUIT MULTIPORT MEMORY HAVING SERIAL ACCESS BIT MASK REGISTER AND METHOD FOR WRITING IN THE MULTIPORT MEMORY

This application is a continuation of application Ser. No. 08/171,370 filed Dec. 20, 1993, now abandoned, which is a continuation of application Ser. No. 08/073,247 filed Jun. 7, 1993, now abandoned, which is a continuation of application Ser. No. 07/989,456 filed Dec. 9, 1992, now abandoned, which is a continuation of application Ser. No. 07/433,339 filed Nov. 8, 1989, now abandoned.

BACKGROUND OF THE INVENTION

1. Field of the Invention

This invention generally applies to digital processing, specifically the manipulation of images mapped within a multiport device containing random access memory (RAM) and serial access memory (SAM). Specifically, this application discloses an integrated circuit (IC) architecture wherein a bit mask register (BMR) within a multiport RAM chip shares address decode and clock circuitry with SAM. This architecture has utility in high-speed applications such as real-time video windowing into memory mapped computer graphics.

2. Description of the Related Art

Figure 1:
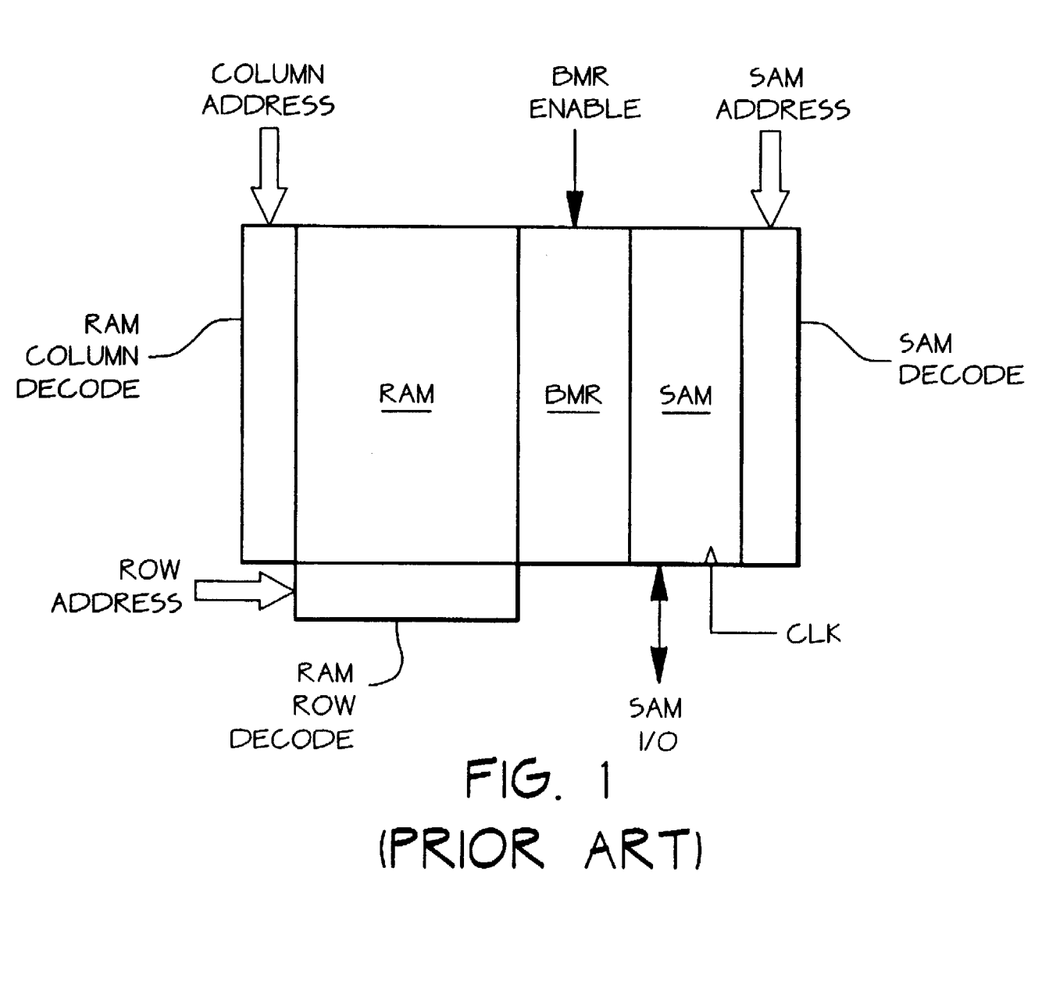
FIG. 1 shows prior art BMR architecture.
Figure 2A:
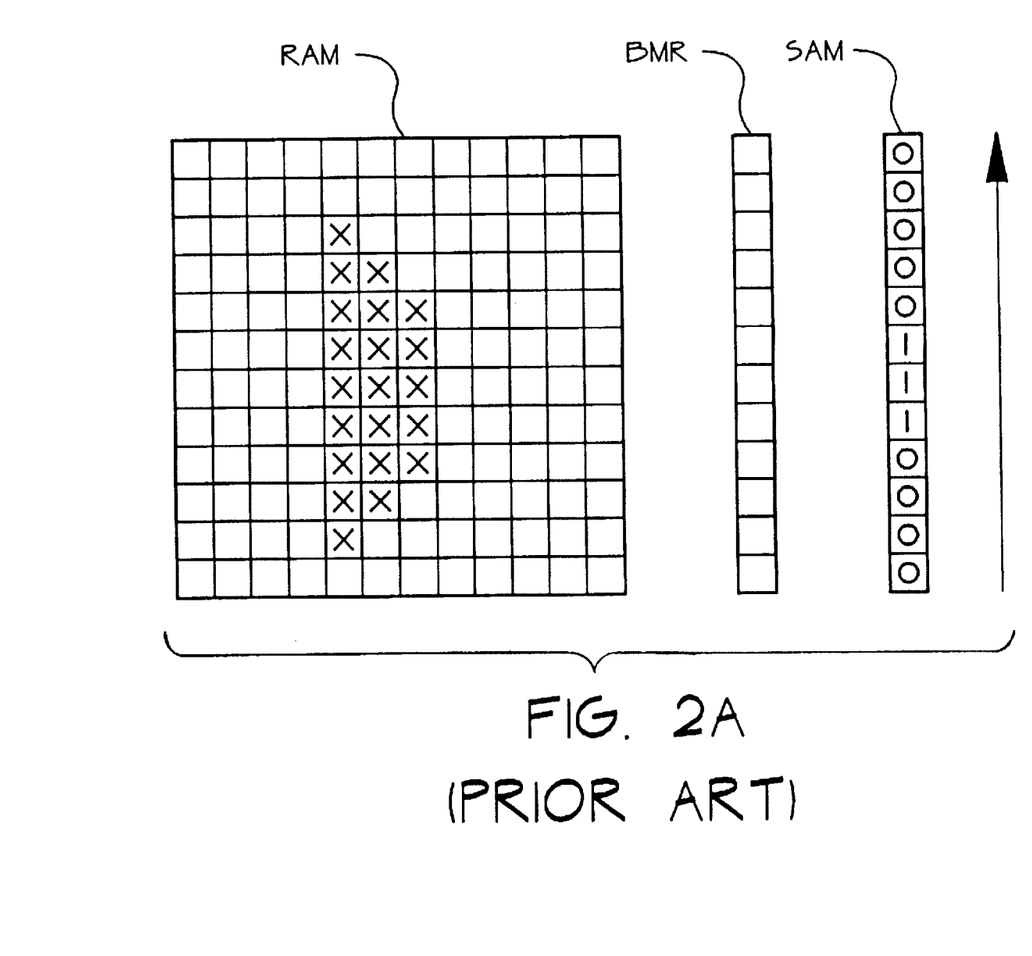
FIGS. 2A, 2B, 2C and 2D illustrate the prior architecture in use.
Figure 2B:
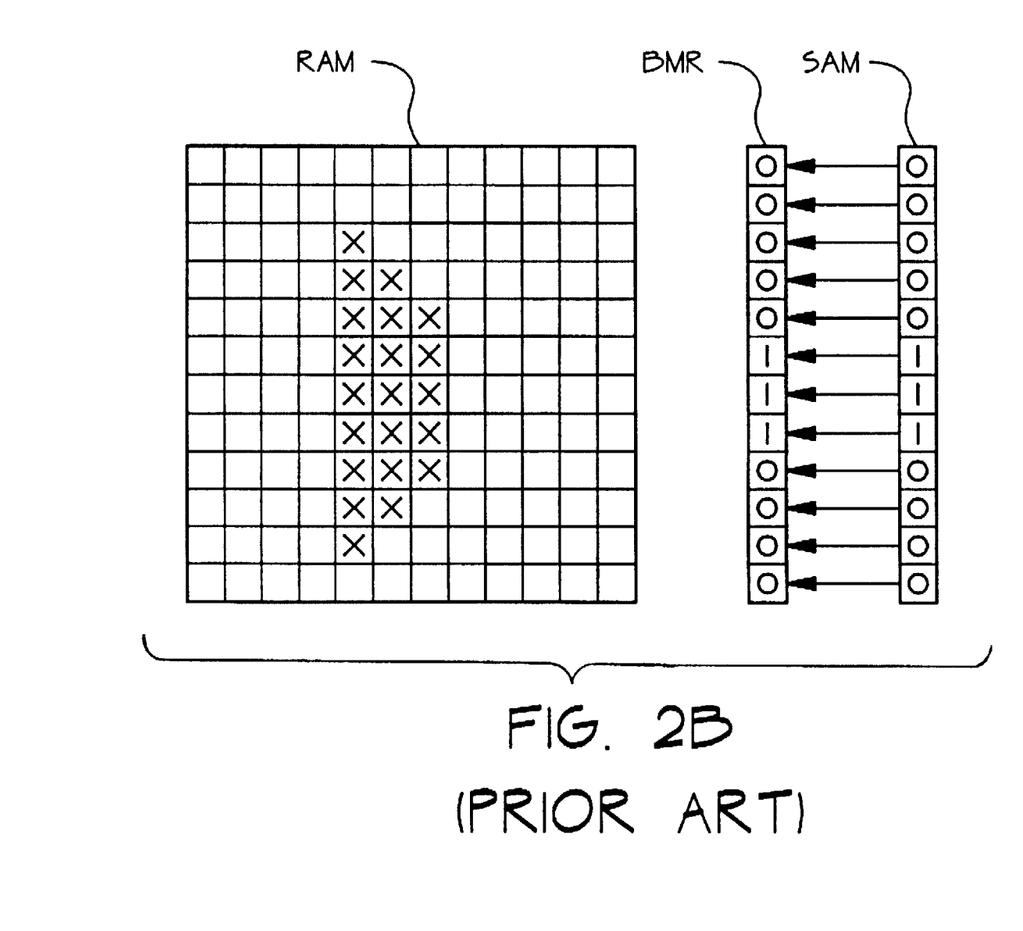
Figure 2C:
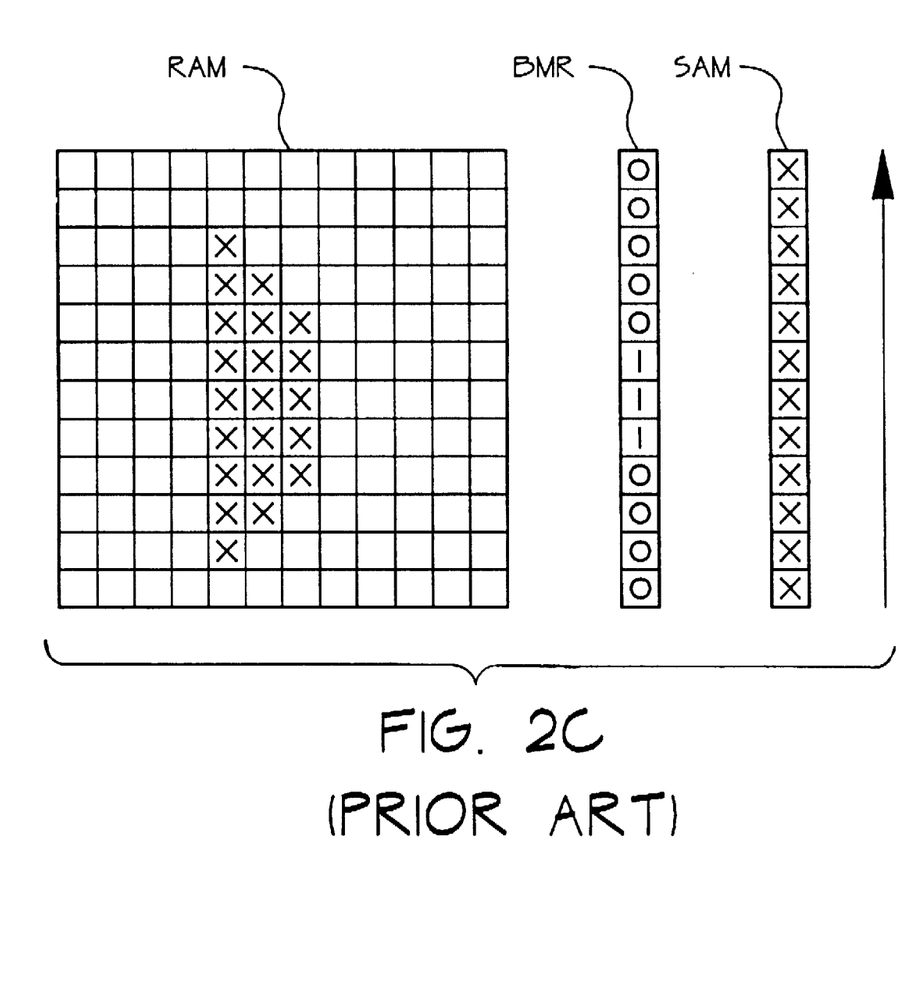
Figure 2D:
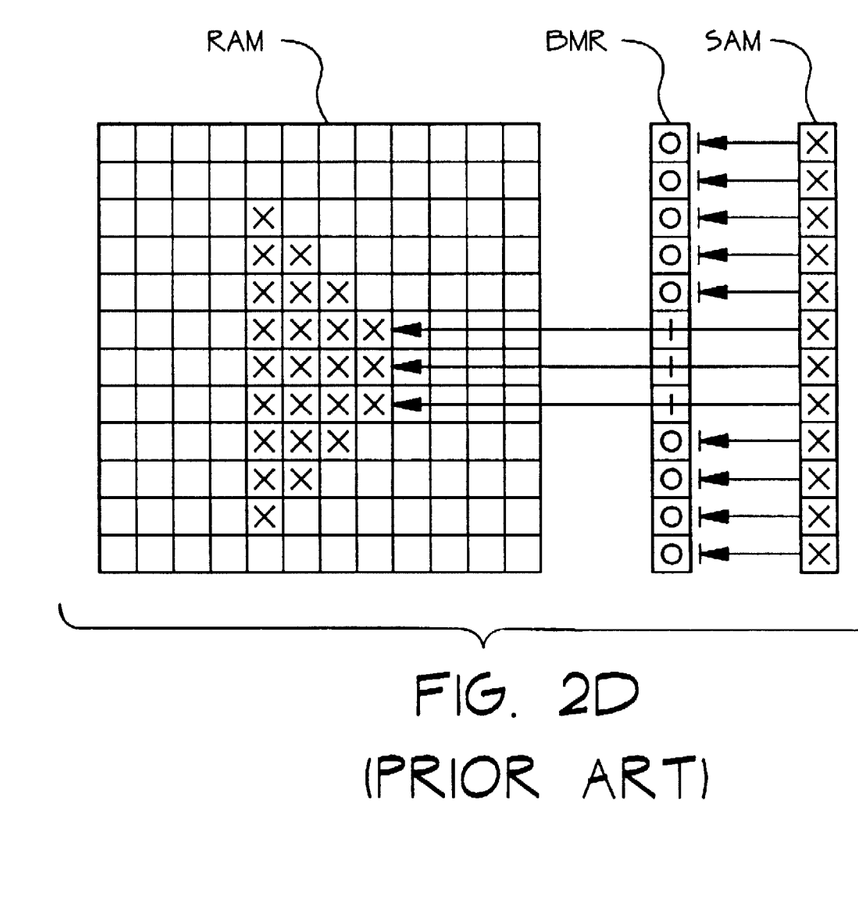

The closest prior art device known is a video RAM (VRAM) belonging to Digital Equipment Corporation (DEC), of Maynard, Mass. A simplified view of the pertinent architecture in this device is shown in FIG. 1. A row of data can be serially written into SAM, and then transferred in parallel from SAM to a selected RAM row. If the BMR is disabled, all data in SAM transfers unaltered to the RAM row. If the BMR is enabled and loaded with mask bits, selected bits in SAM will be masked by the BMR during said transfer (now a "bit masked" transfer), allowing only selected (non-masked) bits in the RAM row to be updated, while other (masked) bits in the RAM row remain unaltered.

Mask bits are generally loaded into the BMR by serially clocking them into SAM, then transferring them into the BMR. Alternately, mask bits can be transferred to the BMR from a row in RAM. Bits may also be transferred out of the BMR into RAM or SAM. It is noted here that in the DEC part, whenever bits are transferred out of the BMR, they are mandatorily inverted. This is so that a RAM row can be inverted by transferring from the RAM row to the BMR, then transferring from the BMR back to the same RAM row.

One way such an architecture might be used is in memory mapped image processing. Assume for the sake of clarity that an entire display field is mapped in the RAM section of said VRAM, where, for example, a '1' represents a bright pixel and a '0' represents a dark pixel. A new rectangular window of data is written into the map by the procedure below. Mask bits define one dimension of the window (how many columns wide) and the number of rows windowed defines the other dimension (how many rows high).

1. Serially input mask bits into SAM.
2. Transfer mask bits from SAM to the BMR.
3. Serially write a row of new window data into SAM.
4. Bit masked transfer from SAM to RAM.
5. Repeat steps 3–4 for each RAM row to contain the new window.

In the case of non-rectangular windowing (say, triangular) a similar, more time-consuming procedure is required. This procedure is illustrated in FIG. 2.

1. Serially input mask bits into SAM (FIG. 2A).
2. Transfer mask bits from SAM to the BMR (FIG. 2B).
3. Serially write a row of new window data into SAM (FIG. 2C).
4. Bit masked transfer from SAM to RAM (FIG. 2D).
5. Repeat steps 1–4 for each RAM row to contain the new window.

This architecture has some inherent speed limitations. For example, a window is generally less than the maximum columns wide, requiring only a partial row to be masked during bit masked transfer from SAM to RAM. However, prior art leaves no option for partially loading the BMR: an entire row must be loaded, regardless of window width desired.

Another limitation surfaces in non-rectangular windowing. Because the BMR has no address decode circuitry, it has no direct serial input and steps 1 and 2 in the above procedure become obligatory for every row in the new window.

Further, the DEC choice of mandetorily inverting data transferred out of the BMR hinders the versatility of the BMR's possible use as a storage register, similar to SAM.

A higher speed BMR architecture is desirable, having features to overcome the above limitations.

SUMMARY OF THE INVENTION

According to the inventive architecture, a BMR is provided which has its own input port, and which shares address decoding with SAM: when a SAM cell is selected, a corresponding BMR cell is simultaneously selected by the same address decode circuitry.

This architecture is high speed in that it allows simultaneous loading of new data into SAM and corresponding mask bits into the BMR to facilitate an application such as memory mapped video windowing. The invention also contains an automatic BMR clear feature that, coupled with the shared decode, increases loading speed of a partial row of mask bits.

The inventive architecture also is area-efficient because decode is shared. Because the BMR input is clocked by the same clock signal that clocks data into SAM, the only additional pins needed for this IC are the BMR input pins.

Optional true or complement transferring into and out of the BMR is also provided to enhance flexibility of use.

The combination of these features provide a high speed, area efficient BMR architecture with enhanced image processing utility.

DETAILED DESCRIPTION OF THE PREFERRED EMBODIMENT

Figure 3:
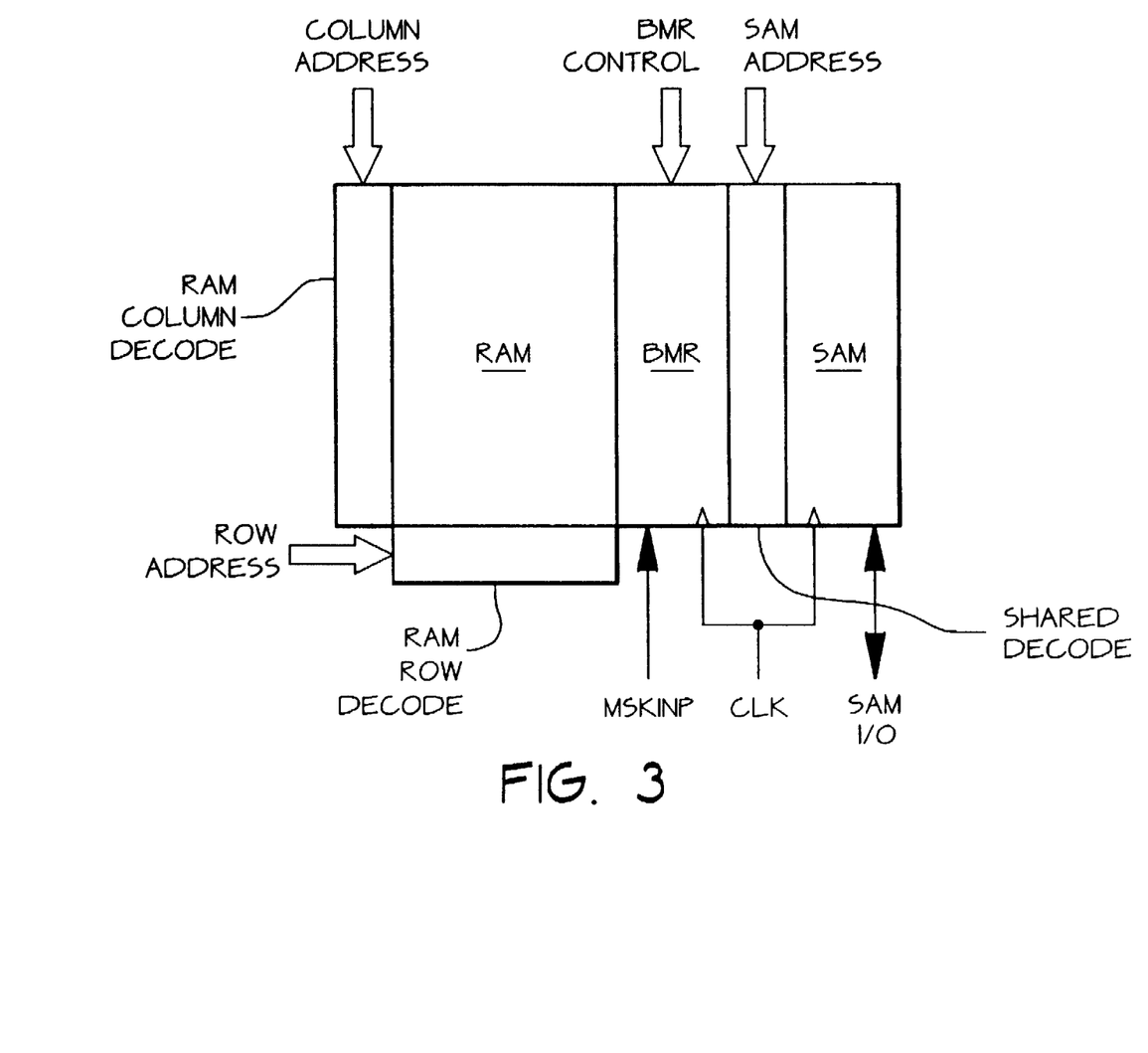
FIG. 3 illustrates the inventive BMR architecture.

A diagram of a preferred embodiment of the invention is shown in FIG. 3. What should be immediately apparent when compared to the prior art in FIG. 1 is that the invention includes shared decode circuitry and shared clocking (CLE) between the BMR and SAM, and the BMR has input means MSKINP.

Figure 4:
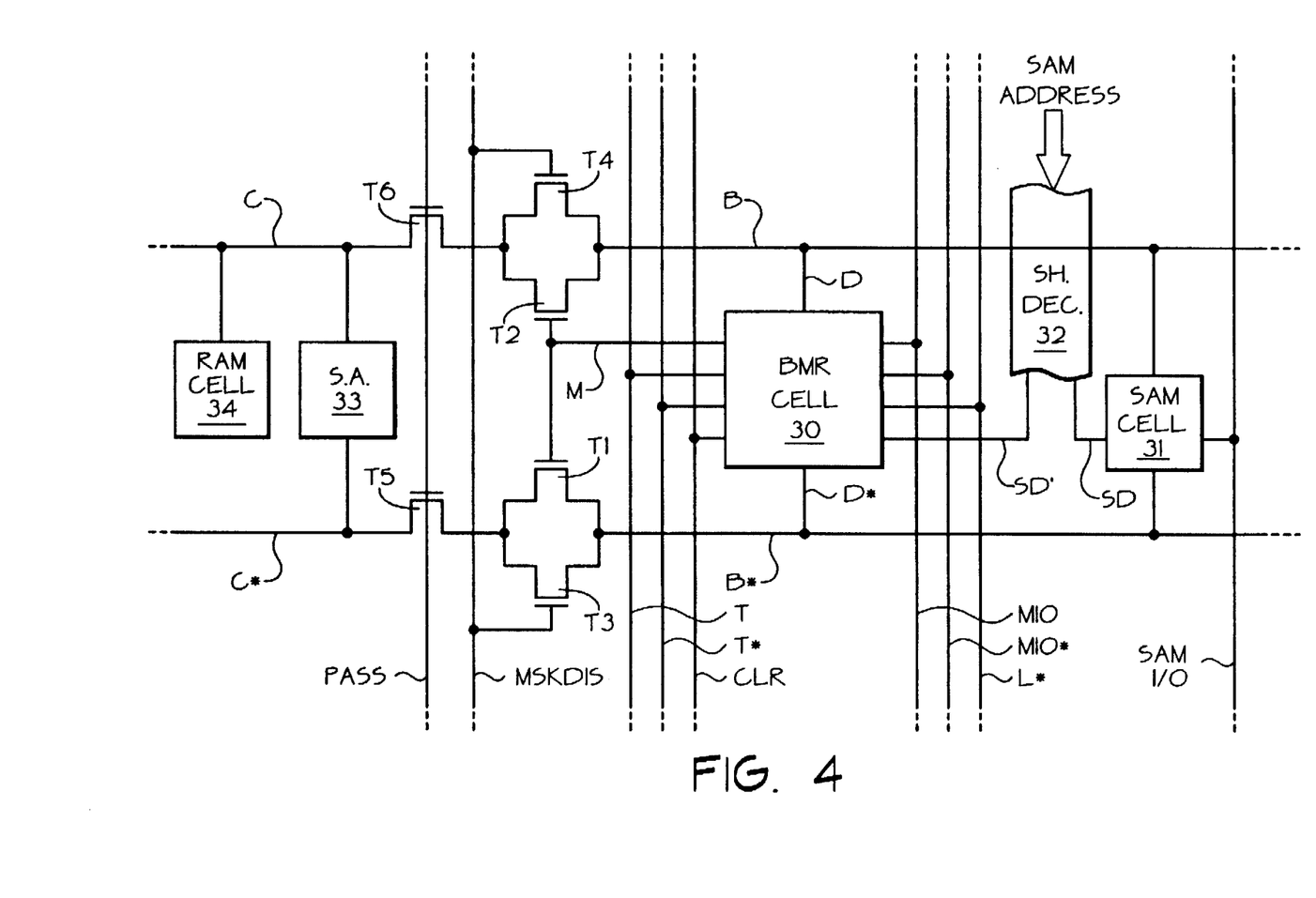
FIG. 4 details a one column wide slice of the inventive architecture.

A single-column slice of the inventive architecture is detailed in FIG. 4. Exemplary RAM cell 34 and sense amplifier 33 connect to folded bitlines C and C* ("*" indicates inversion).

The sense amplifier 33 compares potentials on the bitlines C and C* in a conventional manner. In the operation of the sense amplifier, if a RAM cell, such as RAM cell 34 is connected to its bit line, the stored logic state in the RAM cell 34 will cause its respective bitline C or C* (C in the case of cell 34) to go slightly higher or lower, as the case may be. The sense amp 33 then senses the potential difference between the bitlines C and C* and amplifies that difference. Since the sensed RAM cell 34 is gated on, that cell 34 is thereby refreshed with its logic state and the state of the bitline (in this case C) is set to the sensed logic state. Bitlines C and C* connect to busses B and B* through pass devices T5 and T6, mask devices T1 and T2, and mask disable devices T3 and T4, as shown. BMR cell 30 and SAM cell 31 also connect to B and B*, the BMR cell via I/O lines D and D*. Decode lines SD and SD', driven by shared decode circuit 32 simultaneously selects BMR cell 30 and SAM cell 31 in a given slice. BMR cell 30 drives mask devices T1 and T2 via line M, and has for inputs T, T*, CLR, MIO, MIO*, and L*. A low mask bit empowers masking through devices T1 and T2 during a transfer between RAM cell 34 and SAM cell 31 along busses B and B*.

Figure 5:
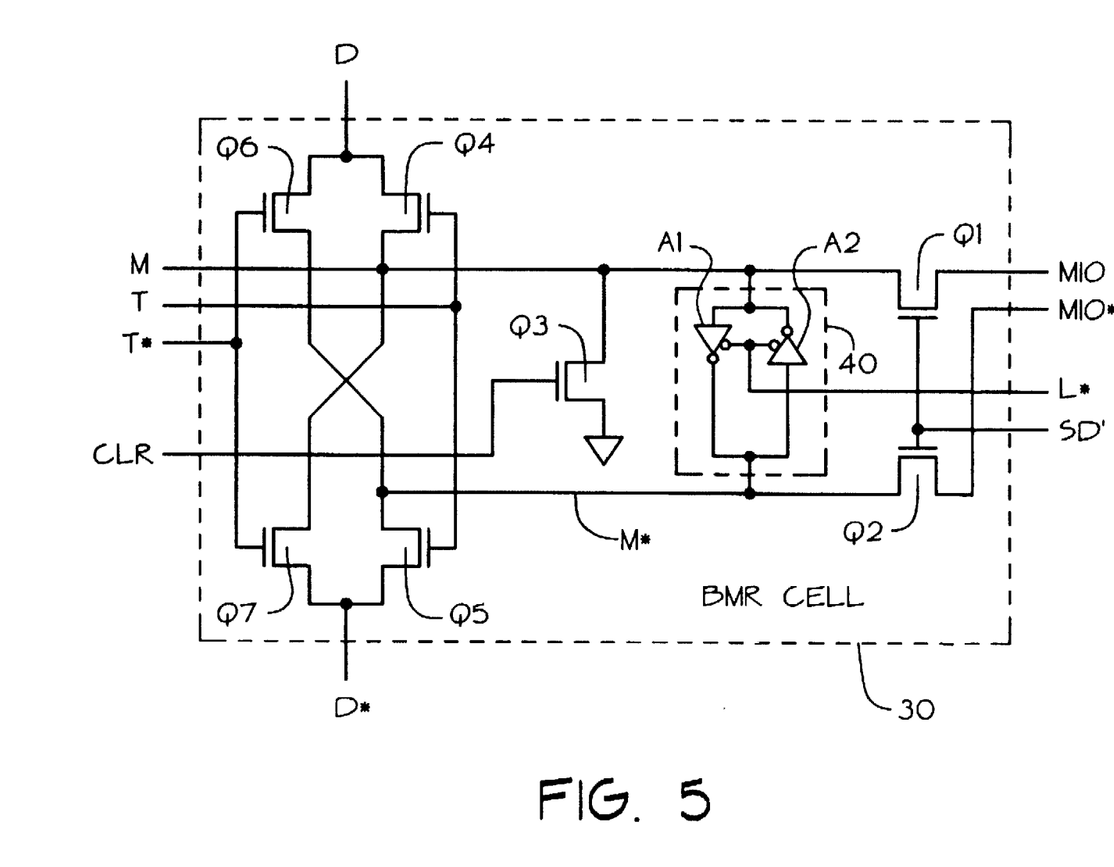
FIG. 5 details a BMR cell in the inventive architecture.

FIG. 5 provides detail on BMR cell 30. At its heart is a mask bit latch 40 formed by opposing buffers A1 and A2 and enabled by latch signal L*. When shared decode outputs SD and SD' are high, SAM cell 31 and corresponding BMR cell 30 are simultaneously selected, allowing a mask bit to be loaded into the latch by input lines MIO and MIO* via Q1 and Q2 at the same time data is loaded into SAM cell 31. MIO and MIO* derive their signal from MSKINP. Signal CLR clears the mask bit through device Q3, and is controlled in such a way that a mask bit latched in BMR cell 30 is automatically cleared after a bit masked transfer. Methods and circuits for this kind of control are easily done by those skilled in this art, and are therefore not detailed herein.

The BMR 30 is thus provided which has its own input ports MIO and MIO*, and which shares address decoding with SAM. When a SAM cell 31 is selected, a corresponding BMR 30 cell is simultaneously selected by the same address decode circuitry.

A sample windowing procedure will now be described, with reference to FIGS. 3, 4, 5, and 6. We wish to write a triangular window of data into the RAM map without disturbing existing data not circumscribed by the new window. A windowing procedure using the inventive architecture is given below.

Figure 6A:
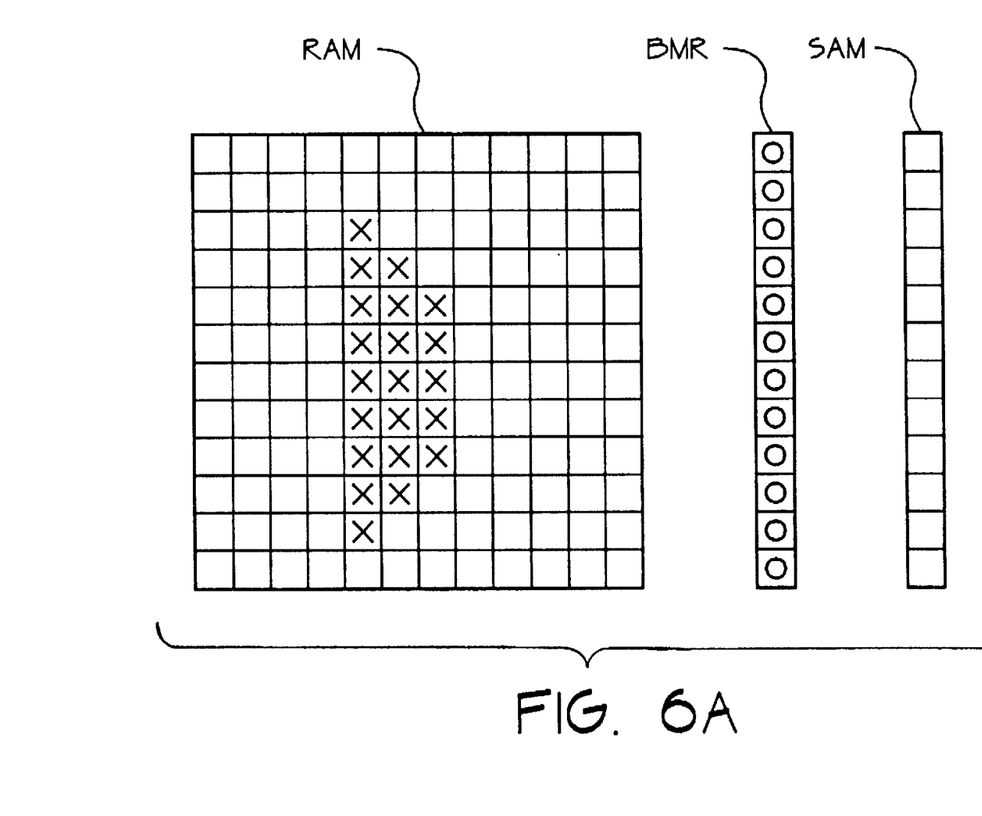
FIGS. 6A, 6B and 6C illustrate the inventive architecture in use.
Figure 6B:
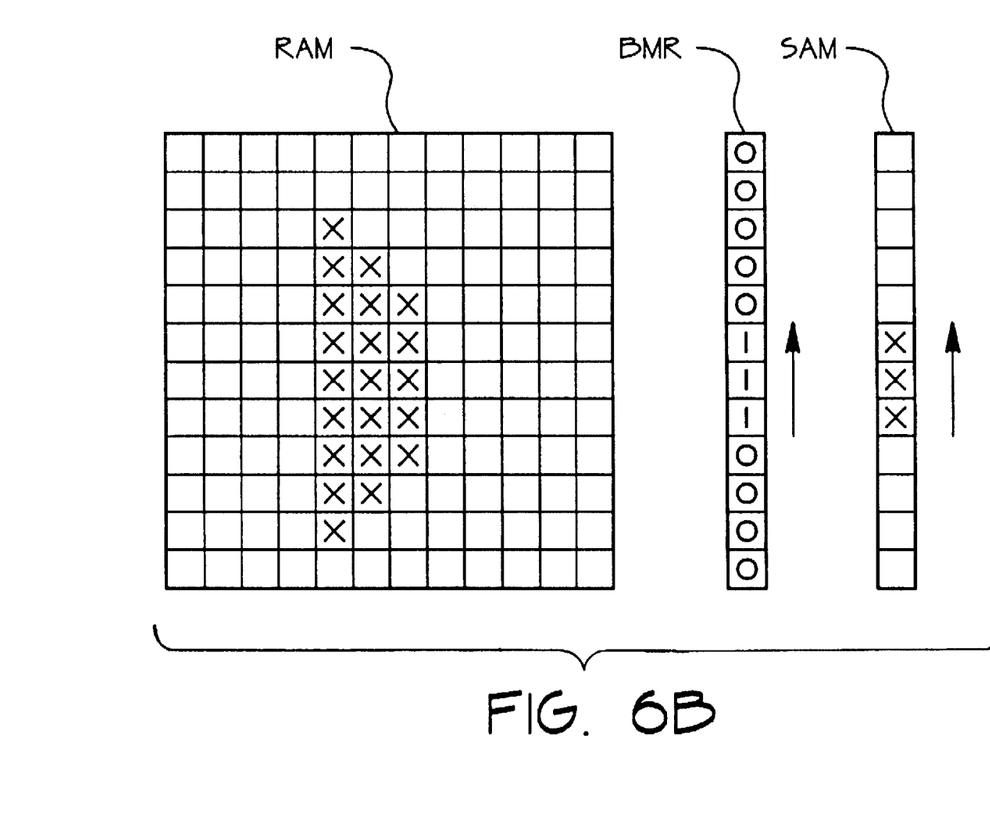
Figure 6C:
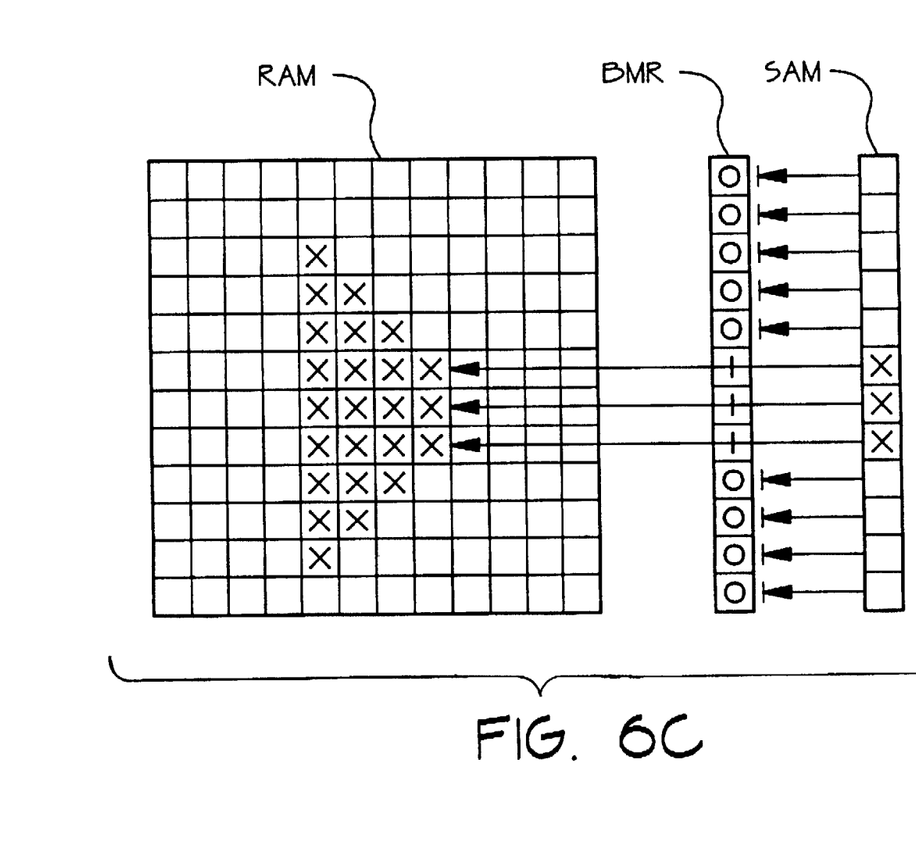

1. Clear mask bits in the BMR (FIG. 6A).
2. Serially input new data into SAM, simultaneously inputting new mask bits into the BMR only at corresponding locations (FIG. 6B).
3. Bit masked transfer from SAM to RAM (FIG. 6C). Mask bits in the BMR are automatically cleared after this transfer (FIG. 6A).
4. Repeat steps 2-3 for each row containing new data.

By virtue of a shorter procedure, this architecture is faster for non-rectangular windowing than the prior art. Automatic clearing of the BMR (step 3, above) helps make this speed possible. For example, suppose a first row and then a second, shorter row are bit masked transferred into the map. In the preferred architecture, if the BMR was not automatically cleared after each transfer, mask bits originally set for the first row would still be active during the second bit masked transfer, making a BMR clearing step necessary. Controlling signal CIR to automatically activate after a bit masked transfer eliminates this slowdown. Automatic clearing also improves the preferred architecture's speed in that a partial row of data can be windowed because locations outside of the window are masked by default by the automatic clear.

If normal (non-masked) transferring is desired between RAM and SAM, BMR cell 30 (representative of the entire BMR) can be disabled by bringing MSKDIS high. This activates T3 and T4, which nullifies the effect of mask devices T1 and T2, regardless of the state of the mask bit on M.

As shown in FIG. 5, devices Q4-Q7 in the preferred architecture allow communication between busses B and B* and mask bit M and M*, via lines D and D*. Signals T and T* control this communication to be off, true, or complement. When T and T* are low, M is isolated from B and B*. When T is high and T* is low, M is connected to B via D and Q4, and M* is connected to B* via D* and Q5: true communication is accomplished between B and M. When T is low and T* is high, M is connected to B* via D* and Q7, and M* is connected to B via D and Q6: complement communication is accomplished between B and M. This inventive feature allows great flexibility in the use of the BMR. Not only can mask data be serially loaded (as in step 2 in the procedure above), it can also be loaded true or inverted into the BMR in parallel during a normal transfer operation. This increases BMR utility as a simple register with invertible outputs.

It is noted that since the BMR and SAM share the same address decode circuitry, the inventive architecture will function as already described in any serial input mode that the decode circuitry is designed to operate in, such as split transfer mode, for example, where a row half is serially written into SAM at the same time that the other row half is being transferred into RAM.

Since this architecture shares SAM decode circuitry with the BMR, circuit area is efficiently used. Because the BMR shares the SAM CLK input, no additional clock pins are required. The only extra pins required over the prior art are the BMR input pins, which will usually be singular in nature. It is noted here that an input to the BMR can be generated internal to the IC, if a default mask input value is chosen, say, '1' to automatically allow new SAM data to transfer unmasked through the BMR. However, bringing mask input external to the chip allows greater flexibility in masking operations.

Figure 7:
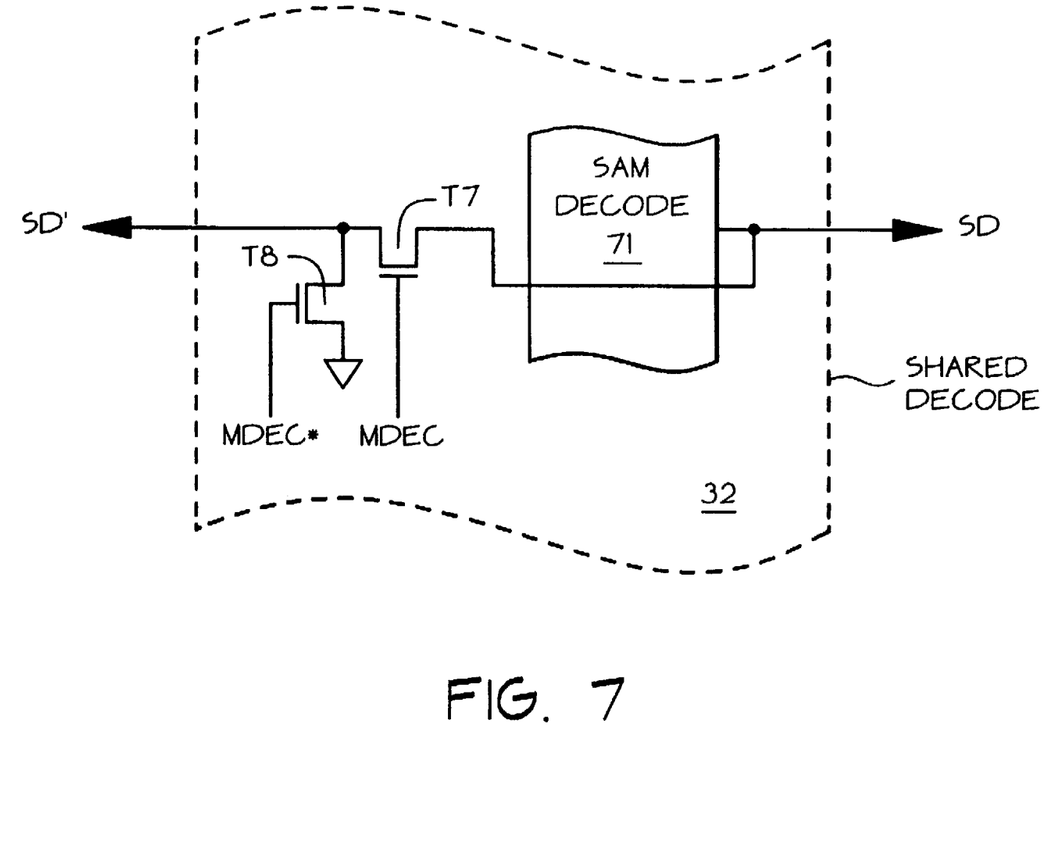
FIG. 7 illustrates BMR decode disablement for the slice of FIG. 4.

To further increase speed, the architecture includes BMR decode disablement, so that when the BMR is not required, the decode circuitry is not loaded down by it, hence allowing SAM to be decoded faster. This is particularly useful during serial I/O to SAM when serial mask input mode is not desired. Therefore, BMR decode (SD' in FIG. 4) is enabled only when the IC is in serial mask input mode. Otherwise, BMR decode SD' is disabled. FIG. 7 illustrates how such disablement can be accomplished. When signal MDEC is high, representative of when the IC is in serial mask input mode, SD' is enabled via device T7. When MDEC is low, MDEC* is high. SD' is disabled and brought to ground via T8.

"Serial mask input mode" is the term used to describe the ability to serially input mask data directly to the BMR. When SAM is able to receive serially inputted data, the SAM is said to be in "input mode". When SAM is configured to serially output data, the SAM is said to be in "output mode".

I claim:

1. An integrated circuit comprising:
   a. a first memory array;
   b. a second memory array;
   c. a bit mask register coupled to said first and said second memory arrays, said bit mask register comprising a serial node; and access port adapted to load a mask into said bit mask register, wherein the integrated circuit is operative to perform a bit masked transfer between said first and said second memory arrays.

2. The integrated circuit of claim 1 wherein said second memory array is a serial access memory.

3. The integrated circuit of claim 2 further comprising an address decoder to select a cell of said bit mask register and a cell of said serial access memory.

4. The integrated circuit of claim 3 further comprising a circuit to decouple said bit mask register from said address decoder.

5. The integrated circuit of claim 2 wherein said bit mask register and said serial access memory are responsive to a clock signal to serially load the mask into said bit mask register while serially loading data into said serial access memory.

6. The integrated circuit of claim 1 wherein said bit mask register is adapted to receive a clear signal to clear said bit mask register.

7. The integrated circuit of claim 1 further comprising a circuit coupled to said first memory array and to said second memory array to allow data transfers between said first memory array and said second memory array without masking.

8. The integrated circuit of claim 1 further comprising a bus to transfer in parallel, the mask between said bit mask register and said first memory array in either direction.

9. The integrated circuit of claim 8 further comprising circuitry to selectively invert the mask which is transferred on said bus.

10. The integrated circuit of claim 1 further comprising a circuit to clear said bit mask register in response to completion of the bit masked transfer.

11. An integrated circuit having a random access memory array, a serial access memory responsive to a clock signal, an address decoder coupled to the serial access memory, and a first serial data port coupled to the serial access memory, the integrated circuit comprising:

a bit mask register coupled to said address decoder wherein said bit mask register is adapted to receive and store a mask via a second serial data port in response to the clock signal; and a bus to transfer data from any one to any other one of said random access memory array, said serial access memory and said bit mask register.

12. The integrated circuit of claim 11 further comprising circuitry to selectively mask data transferred between said random access memory array and said serial access memory with the mask stored in said bit mask register.

13. The integrated circuit of claim 11, further comprising circuitry, coupled to said bit mask register, to clear said bit mask register in response to a clear signal.

14. The integrated circuit of claim 13 further comprising a circuit to generate the clear signal in response to completion of data transfer between said random access memory array and said serial access memory.

15. A method for writing a random access portion of a multiport memory device having a plurality of bit mask register cells, a first serial data port coupled to the bit mask register cells, a plurality of serial access memory cells, a second serial data port coupled to the serial access memory cells and a random access memory array coupled to the bit mask register cells and the serial access memory cells, the method comprising steps of:

a) simultaneously addressing a serial access memory cell and a bit mask register cell;

b) loading a data bit from the second serial data port into the serial access memory cell while simultaneously loading a mask bit from the first serial data port into the bit mask register cell; and c) performing a bit masked transfer from the plurality of serial access memory cells to the random access memory array wherein the data bit is masked by the mask bit.

16. The method of claim 15 wherein said step of loading the data bit is performed while said step of loading the mask bit is being performed.

17. The method of claim 15 further comprising a step of clearing the bit mask register cell before said step of loading the data bit.

18. The method of claim 15 further comprising a step of clearing the bit mask register cell in response to said step of performing a bit masked transfer.

19. A memory device having a serial access memory and a memory array, the memory device comprising:

a. a bit mask register adapted to receive a clear signal;

b. a bus coupled to said bit mask register, the serial access memory and the memory array; and c. circuitry to generate the clear signal in response to completion of a bit mask transfer from the serial access memory to the memory array over said bus wherein the bit mask register is cleared in response to the clear signal.

20. A memory device comprising:

a. a random access memory array;
   b. a serial access memory;
   c. a mask register, having a serial data port, to mask data transferred between said random access memory array and said serial access memory; and
   d. a bus coupled to said random access memory array, said serial access memory and said mask register to transfer data in parallel from any one of said random access memory array, said serial access memory and said mask register to any other one of said random access memory array, said serial access memory and said mask register.

* * * * *

UNITED STATES PATENT AND TRADEMARK OFFICE
CERTIFICATE OF CORRECTION

PATENT NO. : 5,787,311
DATED : July 28, 1998
INVENTOR(S) : William K. Waller

It is certified that error appears in the above-identified patent and that said Letters Patent is hereby corrected as shown below:

At Col. 2, line 21, please delete "mandetorily" and insert --mandatorily--.

At Col. 3, line 2, please delete "(CLE)" and insert --(CLK)--.

At Col. 5, line 9, please delete "node; and".

Signed and Sealed this

Ninth Day of March, 1999

Attest:

Attesting Officer

Q. TODD DICKINSON

Acting Commissioner of Patents and Trademarks